United States Patent
Schwarz

(10) Patent No.: US 9,362,856 B2
(45) Date of Patent: Jun. 7, 2016

(54) METHOD AND APPARATUS FOR OPERATING A POWER OUTPUT STAGE

(75) Inventor: Albrecht Schwarz, Rutesheim (DE)

(73) Assignee: Robert Bosch GmbH, Stuttgart (DE)

( * ) Notice: Subject to any disclaimer, the term of this patent is extended or adjusted under 35 U.S.C. 154(b) by 69 days.

(21) Appl. No.: 14/116,072

(22) PCT Filed: Apr. 4, 2012

(86) PCT No.: PCT/EP2012/056148
§ 371 (c)(1),
(2), (4) Date: Nov. 6, 2013

(87) PCT Pub. No.: WO2012/159812
PCT Pub. Date: Nov. 29, 2012

(65) Prior Publication Data
US 2014/0084827 A1    Mar. 27, 2014

(30) Foreign Application Priority Data

May 26, 2011    (DE) .......................... 10 2011 076 516

(51) Int. Cl.
| | |
|---|---|
| *H02H 7/08* | (2006.01) |
| *H02P 6/12* | (2006.01) |
| *H03K 17/082* | (2006.01) |
| *H03K 17/18* | (2006.01) |

(52) U.S. Cl.
CPC .............. *H02P 6/12* (2013.01); *H03K 17/0828* (2013.01); *H03K 17/18* (2013.01); *H03K 2217/0027* (2013.01)

(58) Field of Classification Search
CPC ............. H02P 6/14; H02P 6/001; H02P 6/12; H02P 6/22; H02H 7/093
USPC .................................................... 318/400.21
See application file for complete search history.

(56) References Cited

U.S. PATENT DOCUMENTS

| | | | |
|---|---|---|---|
| 7,417,394 B2 * | 8/2008 | Bay .................. | G01R 31/42 318/434 |
| 2013/0320903 A1 * | 12/2013 | Aalund ................. | H02P 29/021 318/490 |

FOREIGN PATENT DOCUMENTS

| | | |
|---|---|---|
| CN | 101405922 | 4/2009 |
| DE | 3430409 | 2/1986 |
| DE | 19600807 | 8/1996 |

OTHER PUBLICATIONS

International Search Report for Application No. PCT/EP2012/056148 dated Sep. 20, 2012 (2 pages).

* cited by examiner

*Primary Examiner* — Kawing Chan
*Assistant Examiner* — Bradley Brown
(74) *Attorney, Agent, or Firm* — Michael Best & Friedrich LLP

(57) ABSTRACT

The invention relates to a method for operating a power output stage (2), in particular an electrical machine, which comprises a bridge circuit (3) with at least one half-bridge (1), wherein the half-bridge (1) has two power semiconductor switches (4, 5) which are connected in series and which are each supplied with an operating control voltage during normal operation in order to set a power voltage, and wherein the power voltage (u4, u5) of the respective power semiconductor switch (4, 5) is detected for the purpose of short-circuit monitoring. In this case, provision is made, in order to check the functioning of the short-circuit monitoring means in a check mode for the power semiconductor switches (4, 5), for a test control voltage which is below the operating control voltage to be set at least temporarily at the same time.

9 Claims, 1 Drawing Sheet

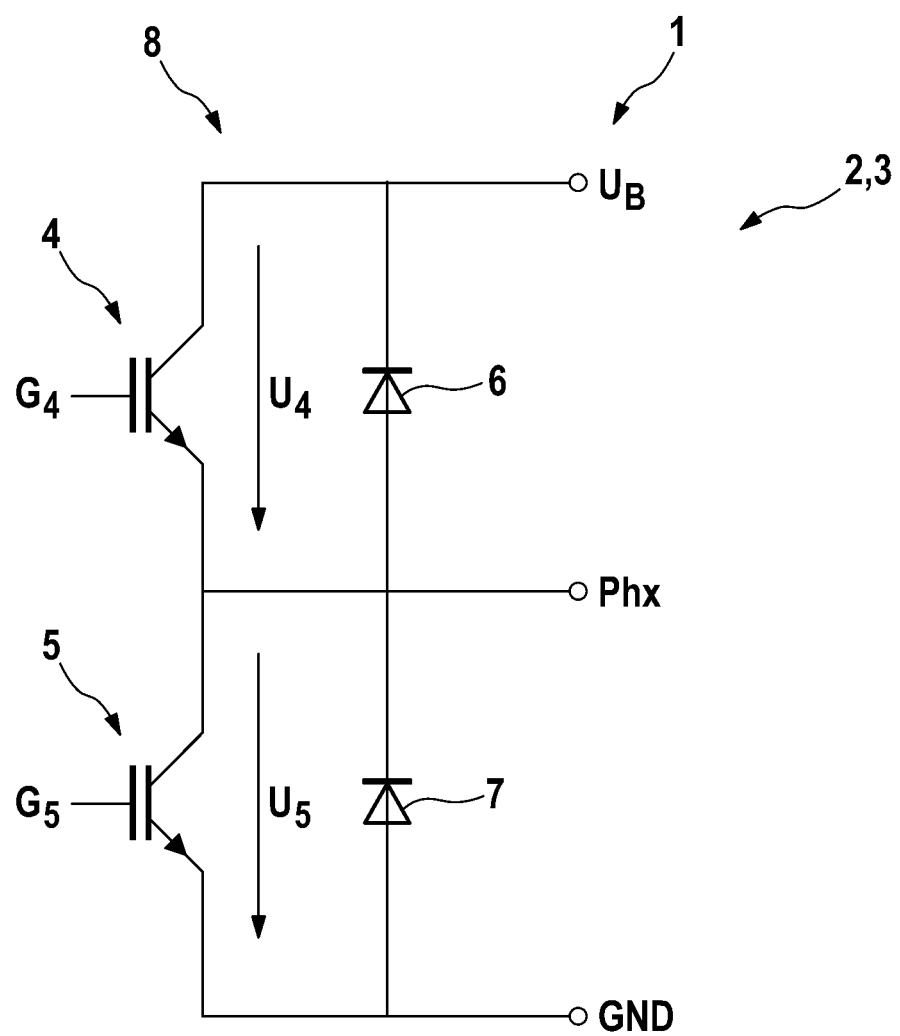

METHOD AND APPARATUS FOR OPERATING A POWER OUTPUT STAGE

BACKGROUND OF THE INVENTION

The invention relates to a method for the operation of a power output stage, in particular of an electrical machine, which comprises a bridge circuit having at least one half-bridge, wherein the half-bridge has two series-connected power semiconductor switches which, in a normal operating mode, are supplied with an operating control voltage in order to set a power voltage, and wherein the power voltage of the respective power semiconductor switch is detected for the purpose of short-circuit monitoring.

The invention also relates to an apparatus for the operation of a power output stage, in particular of an electrical machine, in particular for performing the abovementioned method, having a bridge circuit which comprises at least one half-bridge, wherein the half-bridge has two series-connected power semiconductor switches which, in a normal operating mode, are supplied with an operating control voltage in order to set a power voltage, and having a monitoring device which detects the power voltage of the respective power semiconductor switch for the purpose of short-circuit monitoring.

Methods and apparatuses of the type mentioned at the outset are known from the prior art. In drive apparatuses for motor vehicles comprising an electric drive, for example hybrid drive apparatuses or drive apparatuses for vehicles driven only electrically, power output stages are usually provided for controlling the respective electrical machine, said power output stages comprising power semiconductor switches such as MOSFETs (metal-oxide semiconductor field-effect transistors) or IGBTs (insulated-gate bipolar transistors) and correspondingly associated freewheeling diodes. In order to control polyphase, permanently and/or separately excited electrical machines, one half-bridge of the power output stage is usually assigned to each phase. The respective half-bridge comprises two series-connected power semiconductor switches which, in a normal operating mode, are supplied with an operating control voltage in order to set a desired power voltage.

In order to ensure operating safety, it is also known to monitor the power voltage of the respective power semiconductor switch or at or across the respective power semiconductor switch in order to be able to detect a short-circuit situation. If one of the power semiconductor switches goes into short circuit owing to a failure, then the logic of the half-bridge can no longer maintain the nominal pulse pattern predefined for the electrical machine for the output of torque; in particular, if the second series-connected power semiconductor switch switches despite the first power semiconductor switch being short-circuited. In this situation, a current flows which is generally impermissibly high and, in the worst case, leads to fires in the power circuit since the electrical energy which is usually switched by the power semiconductor switches is very high and the voltage range is so large that arcs possibly remain for a long time. Preferably, the driver circuit of the two power semiconductor switches monitors the respective power voltage. If said power voltage is too high in the switched-on state, it is assumed that an overcurrent is flowing and the entire semiconductor bridge is switched into freewheeling mode by switching-off or deactivating the power semiconductor switches. This is also known as desaturation monitoring or Dsat monitoring. In this case, use is made of the property of the power semiconductor switches whereby they cause a disproportionate increase in the power voltage when the current is too large, the so-called desaturation current. The control voltage provided for the switches is normally high enough that voltages which are as small as possible are dropped in the event of operating currents in the nominal range of the half-bridge or the inverter, that is to say considerably below the desaturation current, as a result of which switching and on-state losses of the semiconductors are reduced or minimized.

For the safety of the drive apparatus, it is now essential that said apparatus should only go into operation when it is ensured that no uncontrolled torque changes which could make the vehicle go out of control act on the drivetrain. Therefore, safety-related hidden faults must be ruled out or reduced to a tolerable residual risk through testing or redundancies. In the case of the desaturation monitoring, this is problematic since the proper function can only be determined when the short-circuit event is artificially induced. Since the short-circuit current or desaturation current is generally very much higher than the nominal current during normal operation, without other precautions, an artificially induced short-circuit would shorten the service life of the electrical components involved and possibly lead to an uncontrolled change in torque.

SUMMARY OF THE INVENTION

The method according to the invention therefore provides that, in order to check the function of the short-circuit monitoring, in a check mode for the two power semiconductor switches of the half-bridge, a test control voltage, which is below the operating control voltage, is at least intermittently set simultaneously. The power semiconductor switches are therefore preferably supplied with a voltage supply which is reduced to a value at which the voltage monitoring of the switch drivers does not yet respond. Since the two power semiconductor switches of the single half-bridge are supplied with the test control voltage at least intermittently simultaneously, a short circuit of the half-bridge is simulated. Furthermore, since the test control voltage is below the operating control voltage, the short-circuit current produced in this case turns out to be lower than if the operating control voltage were present. The power semiconductor switches begin to desaturate within a relatively short time, as a result of which the short-circuit monitoring responds quickly and eliminates the short circuit. The current flowing during the short circuit is in this case preferably set by the selection of the test control voltage to be low enough that the torque pulse produced at the electrical machine as a result is so small that it is safely damped or removed by integration, in particular by the mass moment of inertia of a rotor of the electrical machine, and so no impermissible torque reaches the drivetrain of the vehicle. The check of the function of the short-circuit monitoring is preferably performed when the electrical machine has not been brought into operation or should not produce any torque.

Preferably, firstly one of the power semiconductor switches is supplied with the test control voltage and subsequently the other power semiconductor switch. In this case, the supply of the one power semiconductor switch with the test control voltage is expediently maintained until the other power semiconductor switch has been at least intermittently supplied simultaneously with the test control voltage, since the short circuit is simulated by the simultaneous presence of the test control voltage. Expediently, the voltage monitoring is performed at both power semiconductor switches at the same time or firstly only for one and subsequently for the other of the two power semiconductor switches.

Particularly preferably, metal-oxide semiconductor field-effect transistors (MOSFETs) or insulated-gate bipolar transistors (IGBTs) are used as power semiconductor switches. Preferably, the operating control voltage is given as an operating gate voltage and the test control voltage is given as a test gate voltage in order to set a drain-source voltage as the power voltage. The control voltage is therefore expediently a gate voltage of the respective power semiconductor switch.

Preferably, the test gate voltage is selected such that the power semiconductor switches desaturate at currents slightly above a nominal current. The nominal current is the current which would actually be set by the applied test gate voltage if no short circuit were present. As the test gate voltage was selected as described above, it is ensured that the short-circuit monitoring starts quickly and the flowing currents are not dangerous for the electrical components.

Particularly preferably, the switch-on time of the power semiconductor switches is selected such that the flowing current remains below 2.5 times the nominal current. Assuming standard components, the power semiconductor switches begin to desaturate in the range after 1 μs at the latest. This means that the short-circuit monitoring is preferably set such that it responds shortly afterward and eliminates the short circuit. The check or test ends after approximately 5 μs, in particular if prior art components are used.

It is also provided that, during the check, the electrical machine at standstill is switched into a safe state, preferably by means of an inverter. The inverter is expediently an inverter having the half-bridge. In this case, the control of the inverter can be adapted depending on the type of machine.

During the check, an energy source is preferably connected to the half-bridge via a pre-charging resistor to increase safety. By way of example, the energy source is a traction battery or another energy store. The connection via the pre-charging resistor prevents large currents from being able to flow for a relatively long time in the inverter or the half-bridge. The pre-charging resistor is also used to ensure that, when an operating voltage is applied, the charging current of an intermediate-circuit capacitor of the power output stage does not reach values which are too high and that oscillations of the drain voltage do not occur owing to the low-inductance construction required by the system.

The apparatus according to the invention is distinguished by the fact that, in order to check the function of the monitoring device, in a check mode for the power semiconductor switches, a test control voltage, which is below the operating control voltage, is at least intermittently set simultaneously. Preferably, the check is performed by a driver circuit assigned to the respective power semiconductor switch.

BRIEF DESCRIPTION OF THE DRAWINGS

The invention will be described in greater detail below on the basis of an exemplary embodiment. In this respect, the single figure shows a simplified illustration of a half-bridge.

DETAILED DESCRIPTION

The figure shows a half-bridge 1 of a power output stage 2 (not shown more specifically here) of a drive apparatus which comprises at least one electrical machine as drive unit, which electrical machine is controlled by means of the power output stage 2, more precisely by means of a bridge circuit 3 having the half-bridge 1. Expediently, the bridge circuit 3 comprises a plurality of such half-bridges 1, which are in each case associated with one phase of the electrical machine. The half-bridge 1 has two series-connected power semiconductor switches 4 and 5, which are preferably designed in each case as a MOSFET or IGBT switching element. Each of the power semiconductor switches 4, 5 has a freewheeling diode 6 or 7 associated with it in the usual manner. The half-bridge 1 is assigned to a certain phase or a winding phase of the above-mentioned electrical machine, wherein the winding phase is present at the Phx terminal, which is connected between the source terminal of the power semiconductor switch 4 and the drain terminal of the power semiconductor switch 5 and between the freewheeling diodes 6 and 7. The half-bridge 1 is supplied by means of a corresponding operating voltage $U_B$, which is present at the drain terminal of the power semiconductor switch 4, while the source terminal of the power semiconductor switch 5 is connected to ground GND. For reasons of clarity, the other switching elements present in an inverter are not illustrated. The half-bridge 1, as a part of the bridge circuit 3, forms a component of an inverter 8 (not illustrated in more detail here) which generates the pulse patterns for the electrical machine.

The power semiconductor switches 4 and 5 are operated or controlled via in each case one predefinable gate voltage $G_4$ and $G_5$, respectively, as control voltage. As a result, the logic of the pulse pattern of the half-bridge 1 or the inverter 8 is likewise predefined. The half-bridge 1 enters a critical state if one of the elements of the circuit, in particular one of the power semiconductor switches 4, 5, goes into short circuit as a result of a failure. Assuming that the power semiconductor switch 4 fails, the potential $U_B$ is then constantly present at the winding phase of the electrical machine or at Phx. The logic of the inverter 8 can now no longer maintain the nominal pulse pattern which causes the electrical machine to output a torque; in particular, if the driver circuit switches on the power semiconductor switch 5 (low side) despite the short-circuited power semiconductor switch 4 (high side). In this case, a generally impermissibly high current flows from $U_B$ to GND. In the worst case, this can lead to fires in the power circuit since the electrical energy which is available at $U_B$ is very high and the voltage range is so large that arcs can possibly remain for a long time, that is to say that the arc voltage is smaller than $U_B$. In order to avoid this, the driver circuit (not illustrated in more detail here) of the two power semiconductor switches 4, 5 monitors the drain-source voltages $U_4$ and $U_5$, respectively, as the respective power voltage. If these are too large in the switched-on state, an overcurrent or desaturation current is assumed and the entire half-bridge 1 is switched into freewheeling mode. This so-called desaturation monitoring makes use of the property of the power semiconductor switches 4, 5 whereby they have a disproportionate increase in the voltages $U_4$, $U_5$ when the saturation current is too large. In order to operate the half-bridge 1, preferably a gate voltage is in each case made available to the power semiconductor switches 4, 5 in the normal operating mode, said gate voltage being high enough that as far as possible very small voltages in the event of operating currents in the nominal range of the inverter 8, that is to say considerably below the desaturation range, in order to minimize switching and on-state losses of the semiconductor elements.

In order to ensure safety, a monitoring device, which monitors the power semiconductor switches 4, 5 for short circuits, is provided. In order to be able to ensure safety during operation, the short-circuit monitoring is preferably checked for operability when the electrical machine is at standstill, and so it can be ensured that, if a short circuit does actually occur as a result of a failure, this can be detected and remedied by means of the short-circuit monitoring device, by the power semiconductor switches being switched off.

The monitoring device (not illustrated in more detail here), which is preferably integrated in the driver circuit, supplies the power semiconductor switches 4, 5 at least intermittently simultaneously with a test gate voltage, which is below the operating gate voltage, in order to check the short-circuit monitoring. According to the present exemplary embodiment, the gate test voltages are reduced to a value at which the voltage monitoring of the driver circuit does not yet respond. The values in this case are chosen to be low enough that the power semiconductor switches 4, 5 already desaturate at currents slightly above, that is to say—depending on the application—for example starting from double, the nominal current. Preferably, the power semiconductor switches 4, 5 are successively switched into short circuit by first one and then the other power semiconductor switch being supplied with the test gate voltage. In this case, the switch-on time of the power semiconductor switches 4, 5 is selected such that the current would remain below 2.5 times the nominal current. Conventional semiconductor elements then begin to desaturate approximately one microsecond (1 μs) later. That means that the desaturation monitoring is set such that it responds shortly afterward and eliminates the short circuit. The check then ends after five microseconds (5 μs) at most, as long as standard components are used. During the check, the electrical machine of the drive is preferably at standstill and is switched into a safe state by means of the inverter 8. The torque pulse occurring during the check is small enough that it is safely damped or removed by integration by the mass moment of inertia of the rotor of the electrical machine, and so no impermissible torque reaches the drivetrain of the vehicle. Preferably, the energy drawn from the intermediate circuit during the check of all of the phases is limited, depending on the application, to 1 Ws or at least to a value smaller than 1 Ws, in particular smaller than 3 Ws.

Preferably, at least during the check, a traction battery is connected to the half-bridge 1 via a pre-charging resistor to improve safety and so said traction battery provides the operating voltage $U_B$. In addition, another energy provider or energy source can be connected via the pre-charging resistor. As a result of this, no large currents flow in the inverter 8 for a relatively long time. Furthermore, it is preferred that the pre-charging is interrupted as soon as voltages of between 20 volts and 80 volts, in particular between 30 volts and 65 volts, are reached in the intermediate circuit of the inverter. Said voltages are enough to perform the abovedescribed check of the short-circuit monitoring. In this way, the loading of the individual components is further reduced.

The above described method therefore enables a check of a short-circuit monitoring without high short-circuit currents, which could lead to damage to electrical components, being produced. No dangerous, in particular uncontrolled, torques are introduced into the drivetrain of a motor vehicle having the power output stage 2. The power output stage 2 expediently has a plurality of such half-bridges in order to form the bridge circuit 3. For reasons of clarity, reference is made below to only one of said half-bridges, wherein the half-bridges are identical to one another. By means of the above described method, it is possible to discover any hidden fault before the start-up of the electrical machine. In this case, no cost-intensive redundancies of the switch elements are necessary. Furthermore, the above described method can also be retrofitted at relatively low expense in existing inverters.

The invention claimed is:

1. A method for the operation of a power output stage of an electrical machine, the power output stage including a bridge circuit having at least one half-bridge, wherein the half-bridge has two series connected power semiconductor switches, the method comprising:
    in a normal operating mode, supplying each power semiconductor switch with an operating control voltage in order to set a power voltage;
    in a short-circuit monitoring mode, detecting the power voltages of each respective power semiconductor switch, and determining whether a short-circuit condition exists based on the power voltages; and
    in a check mode for the power semiconductor switches, setting simultaneously a test control voltage at each of the power semiconductor switches, which is below the operating control voltage;
    wherein the operating control voltage is an operating gate voltage, the test control voltage is a test gate voltage and the power voltage is a drain-source voltage.

2. The method as claimed in claim 1, wherein one of the power semiconductor switches is supplied with the test control voltage and subsequently the other power semiconductor switch is supplied with the test control voltage.

3. The method as claimed in claim 1, wherein at least one from the group comprising metal-oxide semiconductor field-effect transistors and insulated-gate bipolar transistors are used as power semiconductor switches.

4. The method as claimed in claim 1, wherein the test gate voltage is selected such that the power semiconductor switches desaturate at currents slightly above a nominal current.

5. The method as claimed in claim 4, wherein the test gate voltage of the power semiconductor switches is selected such that current during the check mode remains below 2.5 times the nominal current.

6. The method as claimed in claim 2, wherein the short-circuit monitoring mode is performed while the electrical machine is at standstill, and wherein, the electrical machine is switched into a safe state by means of an inverter.

7. An apparatus for the operation of a power output stage, the apparatus comprising:
    a bridge circuit including at least one half-bridge, the half-bridge having two series-connected power semiconductor switches which, in a normal operating mode, are supplied with an operating control voltage in order to set a power voltage;
    a monitoring device which detects the power voltage of the respective power semiconductor switch in a short-circuit monitoring mode; and
    a controller configured to check the function of the monitoring device, in a check mode by using an intermittent test control voltage, which is below the operating control voltage, simultaneously applied to the power semiconductor switches;
    wherein the operating control voltage is an operating gate voltage, the test control voltage is a test gate voltage and the power voltage is a drain-source voltage.

8. The method as claimed in claim 1, wherein the power output stage is a power output stage of an electrical machine.

9. The apparatus as claimed in claim 7, wherein the power output stage is a power output stage of an electrical machine.

* * * * *